(12) United States Patent
Sogawa

(10) Patent No.: US 6,558,859 B2
(45) Date of Patent: May 6, 2003

(54) METHOD OF CHECKING PATTERN MEASUREMENT AND IMAGE RECOGNITION ASSISTING PATTERN

(75) Inventor: Koichi Sogawa, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 51 days.

(21) Appl. No.: 09/851,096

(22) Filed: May 9, 2001

(65) Prior Publication Data

US 2001/0044058 A1 Nov. 22, 2001

(30) Foreign Application Priority Data

May 16, 2000 (JP) ........................................ 2000-142657

(51) Int. Cl.$^7$ ................................................. G03F 9/00
(52) U.S. Cl. ............................................ 430/22; 430/30
(58) Field of Search ...................................... 430/22, 30

(56) References Cited

U.S. PATENT DOCUMENTS 6,365,302 B1 * 4/2002 Yang ............................ 430/30

* cited by examiner

*Primary Examiner*—Christopher G. Young
(74) *Attorney, Agent, or Firm*—Dickstein Shapiro Morin & Oshinsky LLP

(57) ABSTRACT

A method of detecting a position of a size check pattern on a substrate by using a size check apparatus so as to measure a size of the size check pattern for a purpose of checking precision of production, comprising the steps of a) providing image recognition assisting patterns on the substrate on both sides of a portion to be measured of the size check pattern, b) setting the size check apparatus to have an image recognition area that includes both the size check pattern and the image recognition assisting patterns, and c) detecting the position of the size check pattern by use of the size check apparatus based on the size check pattern and the image recognition assisting patterns.

7 Claims, 4 Drawing Sheets

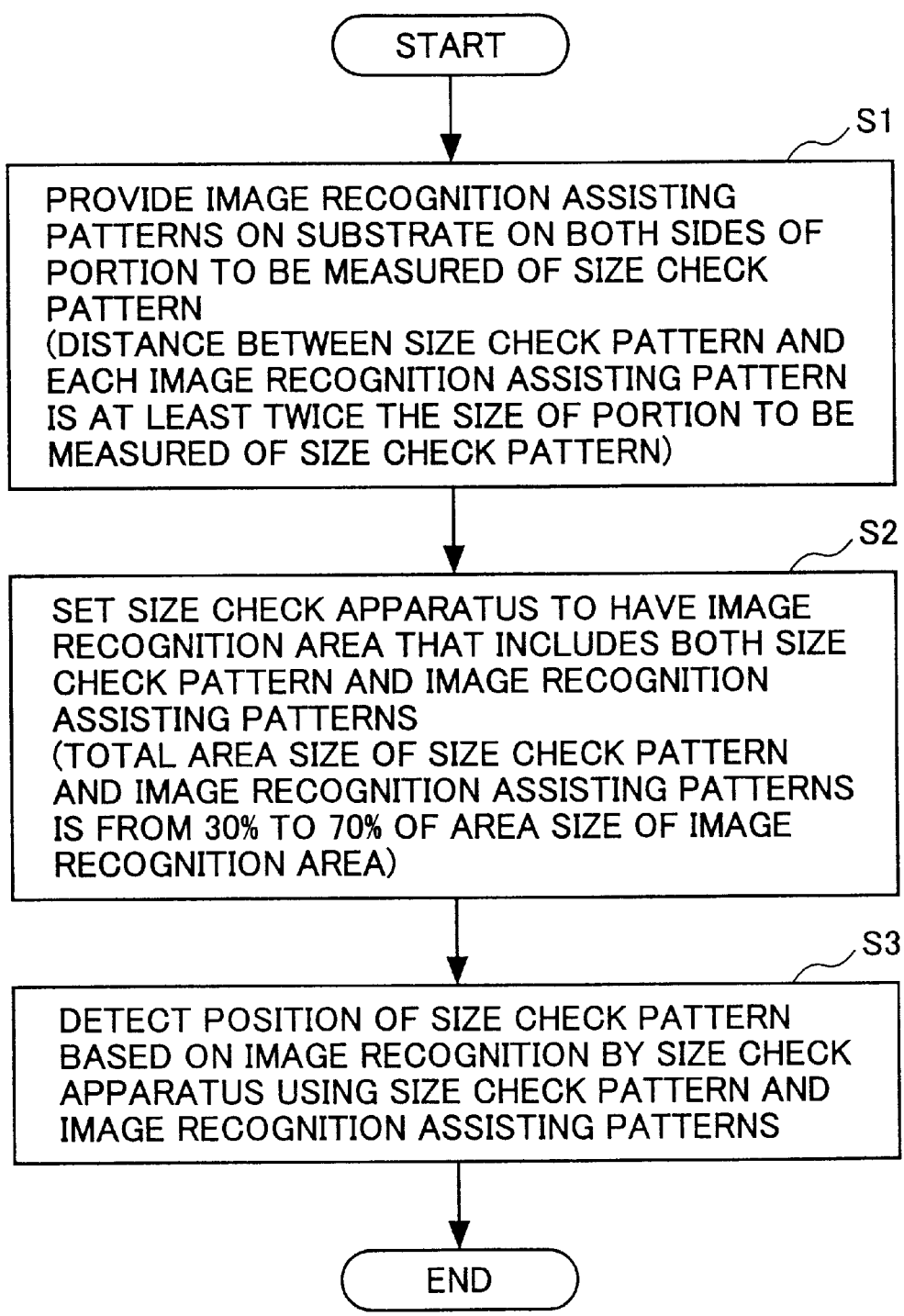

FIG.4

| W# | POINT 1 | | POINT 2 | | POINT 3 | | POINT 4 | | POINT 5 | |
|---|---|---|---|---|---|---|---|---|---|---|
| | NO | USE | NO | USE | NO | USE | NO | USE | NO | USE |
| 1 | 872 | 943 | 906 | 948 | 908 | 948 | 920 | 951 | 906 | 954 |
| 2 | 927 | 944 | 850 | 950 | 851 | 952 | 877 | 954 | 862 | 953 |
| 3 | 904 | 945 | 893 | 954 | 879 | 951 | 884 | 950 | 901 | 951 |

METHOD OF CHECKING PATTERN MEASUREMENT AND IMAGE RECOGNITION ASSISTING PATTERN

BACKGROUND OF THE INVENTION

1. Field of the Invention

The present invention relates to a method of checking pattern measurements that measures a size check pattern to check the precision of production after identifying the position of the size check pattern on a substrate by using a size check apparatus, and further relates to an image recognition assisting pattern that is used to identify the position of the size check pattern.

The method of checking pattern measurements is employed in checking measurements of a pattern formed by a lithography process or an etching process in the manufacture of semiconductor devices or the manufacture of optical devices, for example.

2. Description of the Related Art

In the manufacture of semiconductor devices, checking of measurements for patterning processes has been increasing in its significance because of needs for finer patterns. Cost consideration is important in measuring size, giving rise to complete automation as a major trend in the field.

As an example of related-art methods, a method that is widely used for checking measurements will be described in the following.

A wafer on which semiconductor devices are formed, for example, is subjected to measurement checks. The following description is provided by using a wafer by way of example. A wafer is first set in a size check apparatus. Two points on the wafer are identified for the purpose of positioning, thereby obtaining positional information regarding X, Y, and θ. Then, the apparatus is aligned to a size check pattern based on the obtained information. Since positional accuracy of the size check apparatus is not sufficient at this point, further positional information is obtained. Based on this accurate positional information, the size check pattern is identified, and measurements thereof are taken.

When obtaining positional information, it is necessary to perform pattern matching for image recognition and to identify the pattern as one of the registered patterns.

In summary, this method includes the following steps.

1) detecting two points on the wafer;
2) roughly measure the position of the size check pattern;
3) accurately measure the position of the size check pattern;

In general, at the step 1), image recognition is performed by use of an optical microscope. At the steps 2) and 3), an SEM (scanning electron microscope) is mostly used for the purpose of image recognition.

FIGS. 1A and 1B are illustrative drawings showing an example of a related-art size check pattern. FIG. 1A shows a plan view of the pattern, and FIG. 1B shows an area of image recognition superimposed on the plan view. A size check pattern 2 is of a type generally used. A doted-line box 4 indicates the image recognition area for the size check pattern 2, defining an area within which an image recognition process is performed. In general, the image recognition at the step 2) is carried out by using a SEM image having an enlargement factor of 3000 to 8000.

A size check is carried out by measuring a width a as illustrated by arrows in FIG. 3A.

The size check pattern 2 may be a pattern formed by etching a wafer or a substrate of other types for forming semiconductor device, or may be a resist pattern formed by photolithography.

In order to carry out image recognition of a size check pattern at the step 2), pattern matching is conducted between the size check pattern on the wafer to be checked and the registered size check patterns. If the pattern matching produces a check result exceeding a predetermined threshold, the image recognition process is completed, and the procedure goes on to the next step.

Unfortunately, however, the pattern to be measured and the registered patterns each have varying appearance depending on the conditions of manufacturing process that varies from time to time. That is, these patterns vary from one extreme to the other depending on the size and shape of formed patterns and the type and thickness of layers formed underneath. Typically, the size check apparatus is provided with various algorithms for optimizing conditions. Such algorithms, however, are not sufficiently effective, resulting in recognition errors in many cases. If the threshold is lowered to avoid a failure to recognize, erroneous recognition of a size check pattern will ensue, resulting in an increase in the labor for correcting the errors.

Accordingly, there is a need for a method of image recognition that reduces errors of image recognition during size checks, thereby improving work efficiency.

SUMMARY OF THE INVENTION

It is a general object of the present invention to provide a method of detecting a position of a size check pattern that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method of detecting a position of a size check pattern particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method of detecting a position of a size check pattern on a substrate by using a size check apparatus so as to measure a size of the size check pattern for a purpose of checking precision of production, the method comprising the steps of a) providing image recognition assisting patterns on the substrate on both sides of a portion to be measured of the size check pattern, b) setting the size check apparatus to have an image recognition area that includes both the size check pattern and the image recognition assisting patterns; and c) detecting the position of the size check pattern by use of the size check apparatus based on the size check pattern and the image recognition assisting patterns.

In the method described above, the image recognition assisting patterns are provided on both sides of the portion to be measured of the size check pattern, so that it is possible to bring the black and white contrast of the image recognition area closer to an optimal setting than in the case of no image recognition assisting patterns. This lowers the rate of image recognition errors, and improves a work efficiency of pattern size checks.

BRIEF DESCRIPTION OF THE DRAWINGS

FIG. 2 is a flowchart of a method of detecting a position of a size check pattern according to the present invention;

FIG. 4 is a table of recognition rates that shows comparison between a case in which the image recognition assisting patterns are provided and a case in which no such patterns are provided.

DESCRIPTION OF THE PREFERRED EMBODIMENTS

Figure 1A:
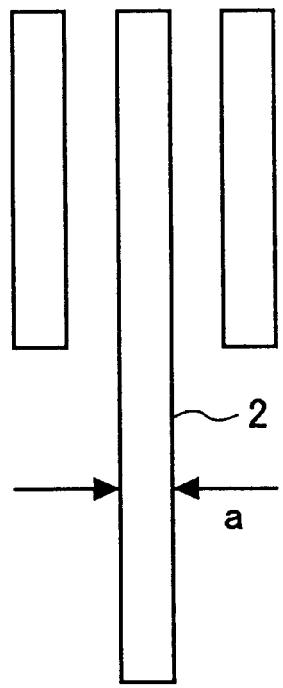
FIGS. 1A and 1B are illustrative drawings showing an example of a related-art size check pattern.

In the following, embodiments of the present invention will be described with reference to the accompanying drawings.

In the present invention, the position of a size check pattern on a substrate is detected by use of a size check apparatus, and, then, the measurements of the size check pattern are taken to check the precision of production. In such a method of checking pattern measurements, the position of size check pattern is detected as follows.

(A) providing image recognition assisting patterns on either side of the size check pattern formed on the wafer;

(B) setting the size check apparatus to have an image recognition area that covers the size check pattern and the image recognition assisting patterns; and (C) detecting the position of the size check pattern through image recognition by the size check apparatus based on the size check pattern and the image recognition assisting pattern existing within the image recognition area.

When the image recognition assisting pattern is provided on both sides of the size check pattern, the image recognition area ends up including the image recognition assisting patterns as well as the size check pattern, so that a ratio of the total area size of these patterns to the area size of the image recognition area can be set equal to a desired value. That is, it is easy to adjust the contrast of the patterns to the other areas within the image recognition area such that the adjusted contrast is appropriate to enhance the image recognition rate.

The total area size B of the size check pattern and the image recognition assisting patterns is preferably 50% of the area size A of the image recognition area. Under such condition, the contrast which is represented as:

$$(B/(A-B))$$

becomes 1 (i.e., 100%), providing the highest recognition rate.

As the ratio of area size deviates farther away from 50%, the contrast lowers. A preferable range of the area size ratio may be from 30% to 70%. If the area size ratio is below or above this range, the drop in the contrast may be so significant that provision of the image recognition assisting patterns would be meaningless.

The distance between the size check pattern and the image recognition assisting pattern is preferably more than twice the size of the size check pattern when only the portion to be measured of the size check pattern is taken into consideration. This is necessary for maintaining the accuracy of measurement checks by the size check pattern. The size check pattern and the image recognition assisting patterns are formed by photolithography if they are resist patterns. In photolithography, a resist layer is formed on a substrate, and is exposed to light through a mask, followed by a development process for patterning. At the time of exposure, if the size check pattern has another pattern in the close proximity thereof, the width of a line of the size check pattern becomes thinner because of optical interference. This is called a proximity effect. In consideration of this, the image recognition assisting patterns are distanced from the size check pattern to leave a sufficient space more than twice the size of the portion to be measured of the size check pattern, thereby preventing fluctuation of the line width caused by the proximity effect. In the case of patterns formed by etching on the substrate, resist patterns are formed prior to the etching, so that such distance as described above is equally effective to avoid a proximity effect at the time of forming these resist patterns.

FIG. 2 is a flowchart of the method of detecting a position of a size check pattern as described above.

As shown in FIG. 2, at step S1, image recognition assisting patterns are provided on the substrate on both sides of a portion to be measured of a size check pattern. A distance between the size check pattern and each of the image recognition assisting patterns is at least twice a size of the portion to be measured of the size check pattern.

At step S2, the size check apparatus is set to have an image recognition area that includes both the size check pattern and the image recognition assisting patterns. The total area size of the size check pattern and the image recognition assisting patterns is from 30% to 70% of the area size of the image recognition area.

At step S3, the position of the size check pattern is detected based on image recognition by the size check apparatus using the size check pattern and the image recognition assisting patterns.

In the method described above, the image recognition assisting patterns are provided on both sides of the portion to be measured of the size check pattern, so that it is possible to bring the black and white contrast of the image recognition area closer to an optimal setting than in the case of no image recognition assisting patterns. This lowers the rate of image recognition errors, and improves a work efficiency of pattern size checks.

Figure 1B:
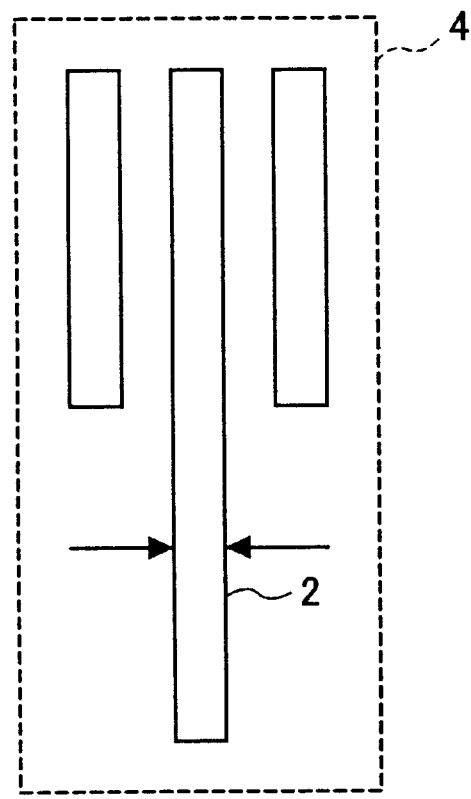
Figure 3A:
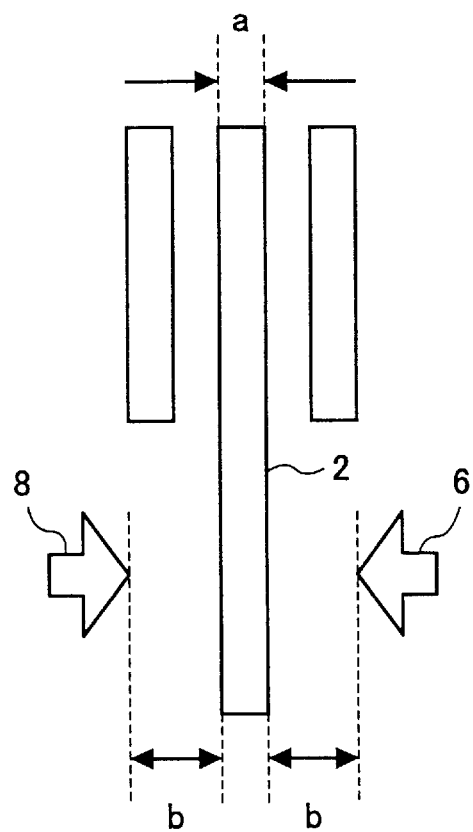
FIGS. 3A and 3B are illustrative drawings showing a size check pattern and image recognition assisting patterns according to the present invention.
Figure 3B:
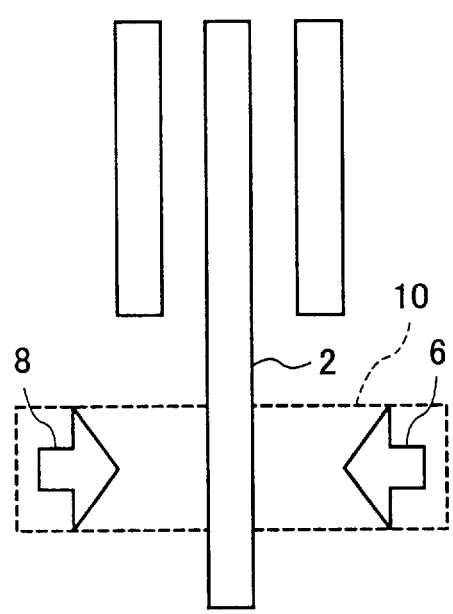

FIGS. 3A and 3B are illustrative drawings showing a size check pattern and image recognition assisting patterns according to the present invention. In FIGS. 3A and 3B, the same elements as those of FIGS. 1A and 1B are referred to by the same numerals.

FIG. 3A shows patterns 2, 6, and 8 that are formed as etching patterns or resist patterns on a substrate. FIG. 3B shows an image recognition area 10 of a size check apparatus superimposed on these patterns. The patterns 2, 6, and 8 may be resist patterns formed on a silicon wafer at the time of manufacturing a semiconductor device, or may be patterns formed on a substrate by an etching process using such resist patterns as a mask. Alternatively, these patterns 2, 6, and 8 may be resist patterns or etching patterns formed on a substrate during the process of manufacturing an optical device, for example, in the technological fields other than the field of semiconductor devices.

As shown in FIGS. 3A and 3B, the size check pattern 2 of a type generally used is provided, and the image recognition assisting patterns 6 and 8 are provided on both sides on the portion to be measured of the size check pattern 2. The image recognition assisting patterns 6 and 8 are shown as having an arrow shape as only an example, and may be of any shape. Requirements are that the image recognition assisting patterns 6 and 8 not exceed the boundaries of the image recognition area 10, and that the ratio of the total area size of the patterns 2, 4, and 6 to the area size of the image recognition area 10 falls within the range between 30% and 70%. This is because a black and white contrast of less than 30% will result in the degradation of successful recognition rates.

As shown in FIG. 3A, a distance b between the portion to be measured of the size check pattern 2 and the image recognition assisting patterns 6 and 8 preferably satisfies the relation:

$$b \leq 2a$$

where "a" is the width of the portion to be measured of the size check pattern 2. This relation is required because if the distance b is shorter than 2a, there is a substantial risk that the proximity effect affects the measured size.

In this example, the image recognition assisting patterns 6 and 8 are arranged symmetrically on both sides of the portion to be measured of the size check pattern 2. Notwithstanding this, the image recognition assisting patterns 6 and 8 may be arranged at asymmetric positions that are at different distances from the size check pattern 2. Further, the image recognition assisting patterns 6 and 8 may be designed to have different shapes from each other. Also, the patterns 2, 6, and 8 may be embossed patterns such as resist patterns, or may be engraved patterns such as formed by etching.

FIG. 4 is a table of recognition rates that shows comparison between the case in which the image recognition assisting patterns 6 and 8 are provided and the case in which no such patterns are provided.

Samples used for the table were taken as follows. At the time of making semiconductor devices, a field process for forming field areas is performed by creating a field oxide layer by the selective oxidation method. In this field process, the patterns 2, 6, and 8 were formed after an etching process that removed the silicon nitride layer provided for the purpose of selective oxidation. W#1, W#2, and W#3 represent three wafers for which the samples were taken. Points 1 through Point 5 represent five different locations on each of the wafers. One sample was taken at each location. The numbers shown in the table indicate recognition rates that are inherent to apparatus. "NO" corresponds to the case in which no image recognition assisting patterns 6 and 8 are formed, and "USE" represents the case in which the image recognition assisting patterns 6 and 8 are used.

As shown in the table, the recognition rates are higher when the image recognition assisting patterns 6 and 8 are used.

Further, the present invention is not limited to these embodiments, but various variations and modifications may be made without departing from the scope of the present invention.

The method of checking pattern measurements to which the present invention is applied is not only used in the process of manufacturing semiconductor devices, but also used in the process of manufacturing devices such as optical devices by use of photolithography and etching in the field other than in the field of semiconductor devices. That is, the present invention is equally applicable to devices other than semiconductor devices when fine production is required.

The present application is based on Japanese priority application No. 2000-142657 filed on May 16, 2000, with the Japanese Patent Office, the entire contents of which are hereby incorporated by reference.

What is claimed is:

1. A method of detecting a position of a size check pattern on a substrate by using a size check apparatus so as to measure a size of the size check pattern for a purpose of checking precision of production, comprising the steps of:

a) providing image recognition assisting patterns on the substrate on both sides of a portion to be measured of the size check pattern;

b) setting the size check apparatus to have an image recognition area that includes both the size check pattern and the image recognition assisting patterns; and c) detecting the position of the size check pattern based on image recognition by the size check apparatus using the size check pattern and the image recognition assisting patterns.

2. The method as claimed in claim 1, wherein said step a) provides the image recognition assisting patterns such that a total area size of the size check pattern and the image recognition assisting patterns is from 30% to 70% of an area size of the image recognition area.

3. The method as claimed in claim 1, wherein said step a) provides the image recognition assisting patterns such that a distance between the size check pattern and each of the image recognition assisting patterns is at least twice a size of the portion to be measured of the size check pattern.

4. The method as claimed in claim 1, wherein the size check pattern and the image recognition assisting patterns are either one of first-type patterns and second-type patters, the first-type patterns being patterns formed in a surface of the substrate by etching, and the second-type patterns being photo-resist patterns formed in the surface of the substrate by photolithography.

5. An image recognition assisting pattern for assisting image recognition of a size check pattern formed on a substrate wherein a size of the size check pattern is to be measured for a purpose of checking precision of production, comprising patterns formed on both sides of a portion to be measured of the size check pattern.

6. The image recognition assisting pattern as claimed in claim 5, wherein a total area size of the size check pattern and the image recognition assisting pattern is from 30% to 70% of an area size of an image recognition area used for the image recognition of the size check pattern.

7. The image recognition assisting pattern as claimed in claim 5, wherein a distance between the size check pattern and the image recognition assisting pattern is at least twice a size of the portion to be measured of the size check pattern.

* * * * *